United States Patent
Han et al.

(10) Patent No.: US 10,442,894 B2
(45) Date of Patent: *Oct. 15, 2019

(54) MICROPOROUS POLYIMIDE SPONGE AND METHOD FOR PRODUCING THE SAME

(71) Applicant: INDUSTRY-ACADEMIC COOPERATION FOUNDATION, YONSEI UNIVERSITY, Seoul (KR)

(72) Inventors: Haksoo Han, Seoul (KR); Myeongsoo Kim, Gyeonggi-do (KR); Jinyoung Kim, Seoul (KR); Gunhwi Kim, Gyeonggi-do (KR); Daero Lee, Jeollabuk-do (KR); Jinuk Kwon, Gyeonggi-do (KR)

(73) Assignee: INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/474,382

(22) Filed: Mar. 30, 2017

(65) Prior Publication Data

US 2017/0298185 A1 Oct. 19, 2017

(30) Foreign Application Priority Data

Apr. 1, 2016 (KR) .................. 10-2016-0040385
Apr. 8, 2016 (KR) .................. 10-2016-0043294

(51) Int. Cl.
| | | |
|---|---|---|
| *C08G 73/10* | (2006.01) | |
| *C01B 33/023* | (2006.01) | |
| *C09D 179/08* | (2006.01) | |
| *H01J 37/28* | (2006.01) | |

(52) U.S. Cl.
CPC ............ *C08G 73/10* (2013.01); *C01B 33/023* (2013.01); *C08G 73/105* (2013.01); *C08G 73/1071* (2013.01); *C09D 179/08* (2013.01); *H01J 37/28* (2013.01)

(58) Field of Classification Search
CPC . C08L 79/08; C08G 73/10; H05K 2201/0154; H05K 3/381
See application file for complete search history.

(56) References Cited

U.S. PATENT DOCUMENTS

| | | | | |
|---|---|---|---|---|
| 3,528,950 | A * | 9/1970 | Lubowitz .......... | C08G 73/1014 526/75 |
| 10,047,207 | B2 * | 8/2018 | Han ..................... | C08J 9/28 |
| 2004/0058143 | A1 * | 3/2004 | Tamemasa ........ | C23C 18/1648 428/319.1 |

OTHER PUBLICATIONS

Kim et al Porous Polyimide Membranes Prepared by Wet Phase Inversion for Use in Low Dielectric Applications, Int. J. Mol. Sci. 2013, 14, 8698-8707, Published: Apr. 24, 2013.*
Wang et al Simple Method for Preparation of Porous Polyimide Film with an Ordered Surface Based on in Situ Self-Assembly of Polyamic Acid and Silica Microspheres, Langmuir 2010, 26(23), 18357-18361, Published on Web Nov. 10, 2010.*

* cited by examiner

*Primary Examiner* — Gregory Listvoyb
(74) *Attorney, Agent, or Firm* — Duane Morris LLP; Gregory M. Lefkowitz; Jason M. Nolan

(57) ABSTRACT

Disclosed is a net-shaped polyimide sponge. The polyimide sponge has a stack structure of nets. Also disclosed is a method for producing a polyimide sponge. The method enables the production of a polyimide sponge in a continuous process, which offers advantages for large-scale production compared to conventional methods using batch systems.

14 Claims, 2 Drawing Sheets

MICROPOROUS POLYIMIDE SPONGE AND METHOD FOR PRODUCING THE SAME

CROSS-REFERENCE TO RELATED APPLICATIONS

This application claims, under 35 U.S.C. § 119, the priorities of Korean Patent Application No. 10-2016-0040385, filed on Apr. 1, 2016, and Korean Patent Application No. 10-2016-0043294, filed on Apr. 8, 2016, in the Korean Intellectual Property Office, the disclosure of which is incorporated herein by reference in its entirety.

BACKGROUND OF THE INVENTION

1. Field of the Invention

The present invention relates to a microporous polyimide sponge and a method for producing the same.

2. Description of the Related Art

Polyimides are used in various applications due to their excellent mechanical properties and good resistance to heat and chemicals. Polyimides can find particular application as special-purpose thermal insulation materials where good heat resistance and chemical resistance are needed. Commercially available polyimide sponge films for thermal insulation are mainly used for energy saving in the chemical industry and other process industries.

Methods associated with the production of polymer sponges are based on the addition of blowing agents, the thermal decomposition of less heat resistant polymers after mixing with more heat resistant polymers, and the addition of ceramic components or porogens.

In addition to these methods based on the addition of pore-forming additives, phase inversion methods using solvents are also known. Wet phase inversion methods are commonly used to produce various polymer sponges. In many cases, wet phase inversion methods using soluble polyimides are applied to the production of polymer films.

On the other hand, a dry phase inversion technique reported by Echiog, et al is also applied to the production of sponge structures from general polyimides whose polyimide backbones are insoluble in solvents. The dry phase inversion technique is easily applicable to polymers of pyromellitic dianhydride and 4,4-oxydianiline. The polymers are, for example, high performance Kapton® (DuPont. Co.) structures. According to the dry phase inversion technique, pyromellitic dianhydride is polymerized with 4,4-oxydianiline in tetrahydrofuran/methanol to prepare a polyamic acid, the polyamic acid is cast into a film, and water is added to induce phase inversion.

SUMMARY OF THE INVENTION

The present invention is intended to provide a microporous polyimide sponge with good heat and chemical resistance and excellent thermal insulation properties. The present invention is also intended to provide a method for producing the polyimide sponge.

The present inventors have conducted a number of studies to achieve the above objects. Based on these studies, the present invention provides a polyamic acid precursor prepared by reacting one or more aromatic dianhydrides with one or more aromatic diamines in an organic polar solvent. The aromatic dianhydrides, the aromatic diamines, and the organic polar solvent include materials whose structures are shown below.

Specifically, the present invention provides a polyamic acid precursor, a high functional microporous polyimide sponge produced using the polyamic acid precursor, and a method for producing the polyimide sponge.

The high functional microporous polyimide sponge of the present invention has a stack structure of microporous nets. Due to this structure, the polyimide sponge of the present invention has improved chemical resistance and can be produced in a simple and economical manner without using any additional chemical compared to existing sponges.

In addition, the method of the present invention enables the production of a microporous polyimide sponge in a continuous process, which offers advantages for large-scale production compared to a method for producing a polyimide sponge using a batch system. The polyimide sponge produced by the method of the present invention has a stack structure of microporous nets and can be applied to thermal insulation materials, drug delivery media, catalyst supports, etc. due to its good chemical stability and excellent thermal insulation and adsorption-desorption properties compared to existing PE, PP, and urethane sponges.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE INVENTION

Figure 1:
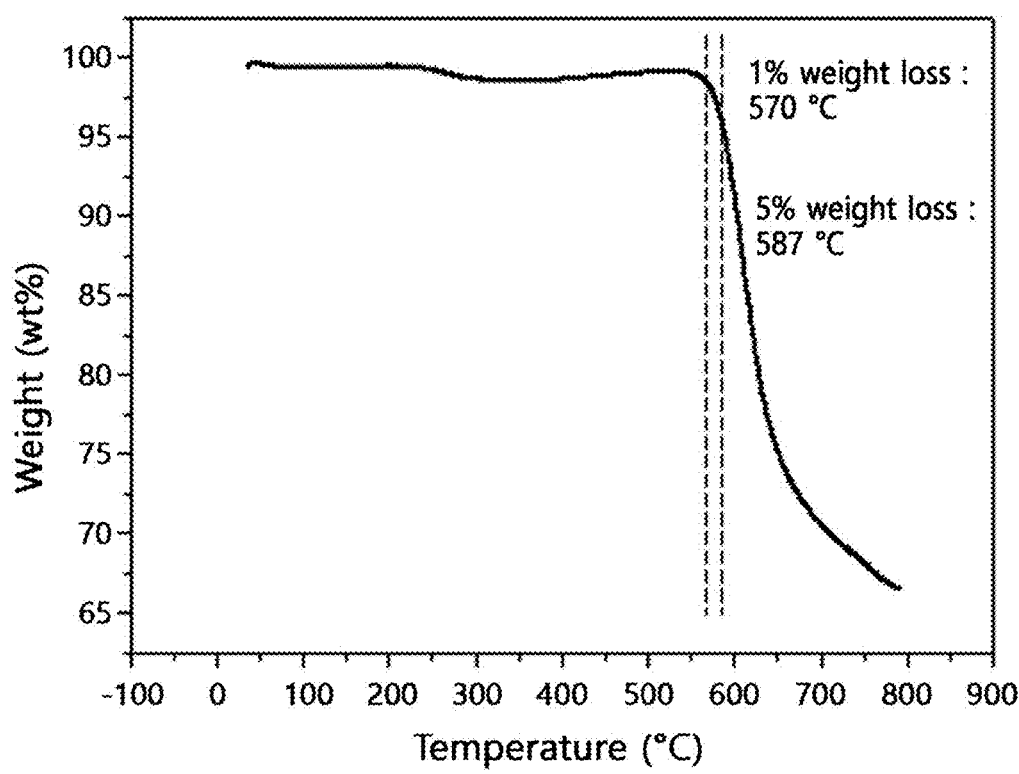
FIG. 1 shows the results of thermogravimetric analysis for a polyimide sponge according to one embodiment of the present invention.

Several aspects and various embodiments of the present invention will now be described in more detail.

The present invention is directed to a method for producing a sponge in a continuous process, which is distinguished from a conventional method for producing a sponge using a batch system.

One aspect of the present invention is directed to a method for producing a polyimide sponge, including (B) immersing a substrate surface coated with a polyamic acid solution in a liquid medium placed in a closed reactor and (C) withdrawing the immersed substrate surface coated with the polyamic acid from the liquid medium, followed by curing in an oven.

The series of steps, including immersion of a substrate surface coated with a polyamic acid solution in a liquid medium to remove a solvent (e.g., NMP) from the polyamic acid solution and conversion of the polyamic acid to a polyimide by curing, eliminates the need to remove the solvent in a vacuum oven, which has conventionally been performed. Thus, the method of the present invention enables the production of a polyimide sponge in a continuous process, which is industrially very useful.

According to the method of the present invention, a polyimide sponge is produced by the following method. First, a substrate surface coated with a polyamic acid solution is immersed in a liquid medium placed in a closed reactor. The coated substrate is immersed in the liquid medium for 1 to 3 hours. During the immersion, a solvent is extracted from the polyamic acid solution by wet phase separation. Then, the solvent-free solid component is transferred to an oven and is cured at a high temperature to produce a polyimide sponge. It is particularly important to adjust the immersion time to the range of 1 to 3 hours. Outside this range, the shape of the sponge cannot be maintained and the porous structure of the sponge cannot be formed uniformly. Furthermore, the glass transition temperature of the sponge is increased by at least 50 □, as measured by DSC, when the substrate surface coated with the polyamic acid withdrawn from the liquid medium is cured in an oven compared to when the surface-coated substrate is thermally cured in a state in which it is immersed in the liquid medium. The increased glass transition temperature indicates greatly improved thermal properties of the sponge. The oven curing also markedly improves the mechanical properties of the sponge.

The polyamic acid solution refers to a state in which a polyamic acid is dissolved in a solvent and the solvent remains completely unremoved. The polyamic acid solution is intended to include gel states similar to the so-called jelly and is not necessarily limited to a fluidic solution. According to the method of the present invention, the solvent is removed from the gel-state polyamic acid solution by phase separation and the solvent-free solid component is then cured.

The polyamic acid has a structure of Formula 1:

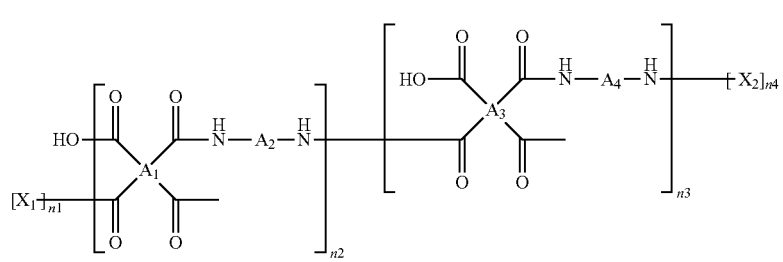

(1)

wherein

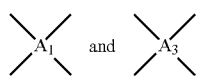 and 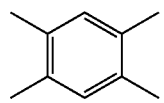

are the same as or different from each other and each independently have one of the structures of Formulae 3a to 3f:

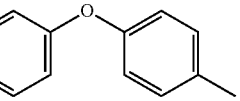

(3a)

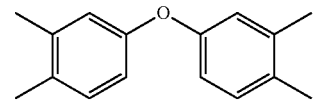

(3b)

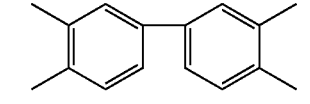

(3c)

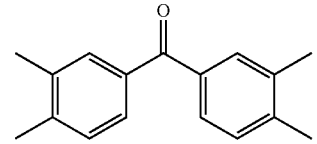

(3d)

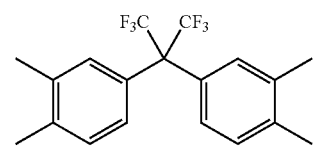

(3e)

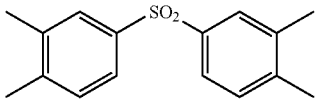

(3f)

-A$_2$- and -A$_4$- are the same as or different from each other and each independently have one of the structures of Formulae 4a to 4j:

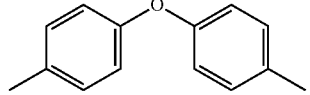

(4a)

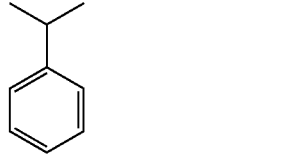

(4b)

(4c)

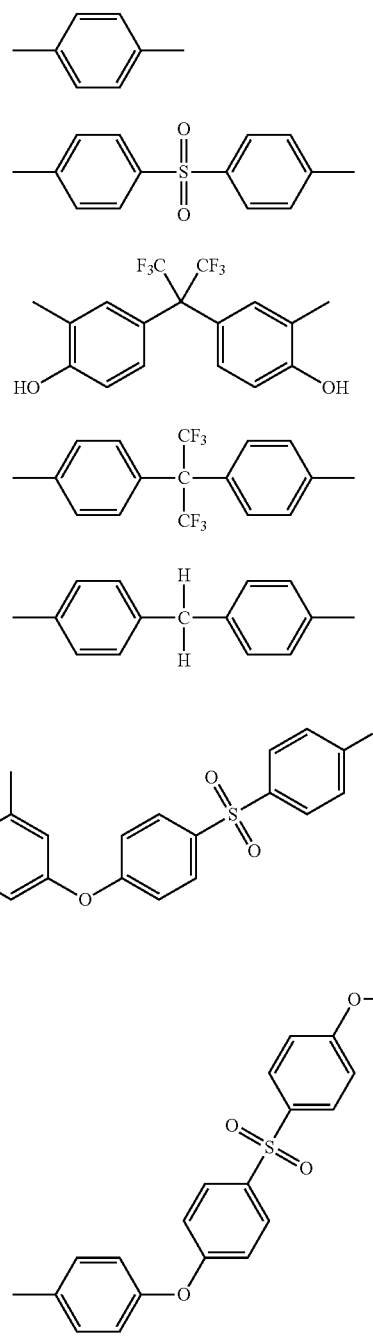

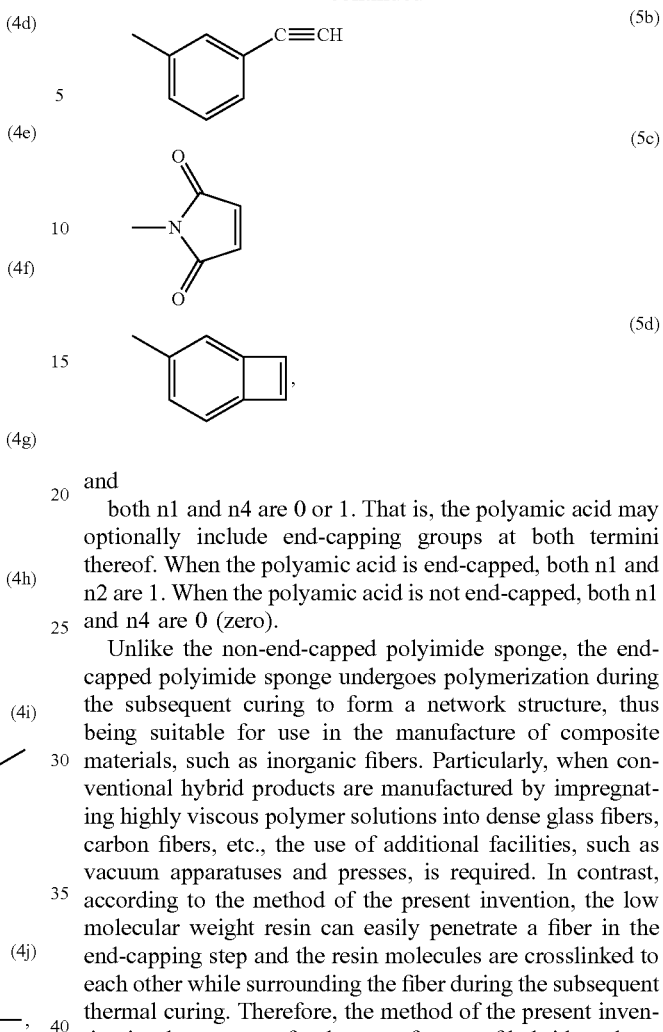

—$X_1$ and —$X_2$ are the same as or different from each other and each independently have one of the structures of Formulae 5a to 5d:

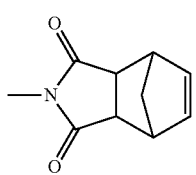

and both n1 and n4 are 0 or 1. That is, the polyamic acid may optionally include end-capping groups at both termini thereof. When the polyamic acid is end-capped, both n1 and n2 are 1. When the polyamic acid is not end-capped, both n1 and n4 are 0 (zero).

Unlike the non-end-capped polyimide sponge, the end-capped polyimide sponge undergoes polymerization during the subsequent curing to form a network structure, thus being suitable for use in the manufacture of composite materials, such as inorganic fibers. Particularly, when conventional hybrid products are manufactured by impregnating highly viscous polymer solutions into dense glass fibers, carbon fibers, etc., the use of additional facilities, such as vacuum apparatuses and presses, is required. In contrast, according to the method of the present invention, the low molecular weight resin can easily penetrate a fiber in the end-capping step and the resin molecules are crosslinked to each other while surrounding the fiber during the subsequent thermal curing. Therefore, the method of the present invention is advantageous for the manufacture of hybrid products in a more efficient manner.

In Formula 1, n2 and n3 are the same as or different from each other and are each independently an integer from 0 to 10,000, with the proviso that at least one of n2 and n3 is not zero. One or more dianhydrides and one or more diamines may be used as monomers of the polyamic acid. When only one dianhydride is used, $A_1$ and $A_3$ in Formula 1 are the same. When only one diamine is used, $A_2$ and $A_4$ in Formula 1 are the same. When only one dianhydride and one diamine are used, $A_1$ and $A_3$ are the same and $A_2$ and $A_4$ are the same.

According to one embodiment, the closed reactor is designed such that the liquid medium is not vaporized.

According to a further embodiment, the liquid medium may be selected from methanol, ethanol, ethyl acetate, acetone, isopropyl alcohol, and mixtures thereof. The liquid medium is preferably acetone or a mixed solvent of acetone and ethyl acetate in a 1:0.5-2 volume ratio. Particularly, the use of a mixed solvent of acetone and ethyl acetate in a 1:0.5-2 volume ratio enables the production of a polyimide sponge with excellent thermal properties and mechanical properties, compared to the use of only one of the above-described solvents.

According to another embodiment of the present invention, the oven is heated to 100 to 350° C. According to another embodiment of the present invention, the oven is heated at a rate of 1 to 50° C./minute.

According to a preferred embodiment, the heating in the oven is performed stepwise at 120 to 160° C. for 4 to 7 hours, at 190 to 210° C. for 0.5 to 2 hours, and at 240 to 260° C. for 0.5 to 2 hours. Particularly, this temperature profile enables the production of a sponge with improved thermal properties, especially markedly improved mechanical properties, compared to simple heating at a constant rate.

According to another embodiment, step (B) includes (B1) determining a desired average pore radius of a polyimide sponge, (B2) determining the height of a liquid medium such that the average pore radius is obtained, and (B3) immersing a substrate surface coated with a polyamic acid solution in the liquid medium, whose height has been previously determined, in a closed reactor.

According to another embodiment, substep (B2) is carried out by determining the height of the liquid medium from a pre-obtained relationship between an average pore radius and a height of the liquid medium.

According to another embodiment, the relationship between the average pore radius $r_p$ and the height $h_s$ of the liquid medium is given by Equation 1 or 2:

$$r_p = k/h_s \tag{1}$$

$$r_p = a \times h_s + b \tag{2}$$

where k, a, and b are constants that can be determined empirically.

As described above, step (B) may include (B1) determining a desired average pore radius of a polyimide sponge, (B2) determining the height of a liquid medium such that the average pore radius is obtained, and (B3) immersing a substrate surface coated with a polyamic acid solution in the liquid medium, whose height has been previously determined, in a closed reactor.

The height of the liquid medium means the distance from the polyamic acid coated on the surface of the substrate to the surface of the liquid medium.

Substep (B2) may be carried out by determining the height of the liquid medium from a pre-obtained relationship between an average pore radius and a height of the liquid medium. The relationship is given by Equation 1 or 2, preferably Equation 2.

According to one embodiment, the relationship is given by Equation 1 where $h_s$ is in inverse relationship with $r_p$. In this embodiment, k can be previously obtained by analyzing the pores of a polyimide sponge produced by the method of the present invention. k may be obtained through only one experiment. Alternatively, k may be an average obtained through several experiments conducted at two or more different heights of the liquid medium.

More preferably, the relationship is given by Equation 2 where as $h_s$ increases, $r_p$ decreases. It was found that the use of the Equation 2 as the relationship is more advantageous in precisely predicting the relation between $h_s$ and $r_p$ in the method of the present invention than the use of a relationship given by Equation 1.

a and b can be obtained through experiments conducted at least two different heights of the liquid medium. For example, a and b may be obtained by the following procedure. First, two reactors are filled with the same liquid medium at different heights $\sim h_s$ (in the strict sense, $h_s$ is a value obtained by subtracting the height of the substrate from $\sim h_s$). Then, substrates surface coated with a polyamic acid solution are immersed in the liquid medium for a certain amount of time, withdrawn from the liquid medium, and cured in an oven to produce polyimide sponges. The pore radius $r_p$ of each of the polyimide sponges is substitute into Equation 2 to obtain a and b.

In one embodiment, a is from $-\frac{3}{5}$ to $-\frac{3}{10}$ μm/cm and b is from 6 to 8 μm.

The pore size can be controlled by varying not only the height of the of the liquid medium but also the kind of the liquid medium used. As the liquid medium, there may be used, for example, acetone, n-hexane, ethanol, isopropyl alcohol or methanol. It has been found that the pore size decreases in the order of acetone, n-hexane, ethanol, isopropyl alcohol, and methanol.

According to another embodiment of the present invention, the method of the present invention may further include, prior to step (B), (A) polymerizing one or two dianhydrides with one or two diamines to obtain the polyamic acid solution. As described above, the polyamic acid solution thus obtained is immersed in the liquid medium in the closed reactor, followed by curing in the oven to produce a polyimide sponge.

The polyamic acid has a structure of Formula 1a:

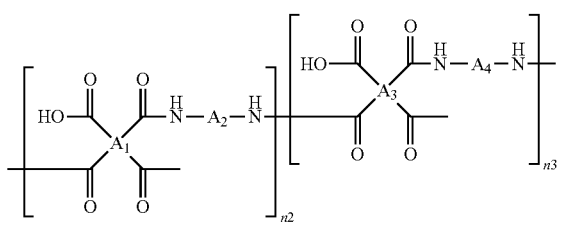

wherein

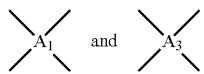

are the same as or different from each other and each independently have one of the structures of Formulae 3a to 3f, -A$_2$- and -A$_4$- are the same as or different from each other and each independently have one of the structures of Formulae 4a to 4j, and n2 and n3 are the same as or different from each other and each independently an integer from 0 to 10,000, with the proviso that at least one of n2 and n3 is not zero.

According to another embodiment of the present invention, the ratio of n2 to n3 (n2:n3) is from 1:20 to 20:1.

According to another embodiment of the present invention, the method of the present invention may further include, prior to step (B), (A') reacting one or two dianhydrides with one or two diamines and (A'') adding one or two end-capping agents to the reaction product solution to endcap the reaction product solution.

Thereafter, the end-capped polyamic acid solution may be immersed in the liquid medium placed in the closed reactor, followed by curing in the oven to produce an end-capped polyimide sponge, as described above. It is advantageous to carry out step (A'') after the reaction is allowed to sufficiently proceed in step (A') in that stopping of the polymerization into the polyamic acid by the end-capping agents can be avoided.

The end-capped sponge has greatly improved thermal properties compared to the non-end-capped sponge. For example, the end-capped sponge has a higher glass transition temperature by at least 100° C. than the non-end-capped sponge, as measured by DSC. In addition, the end-capped sponge has significantly improved mechanical properties and processability compared to the non-end-capped sponge. In conclusion, the end-capped sponge has a more advantageous structure than the non-end-capped sponge.

The polyamic acid has a structure of Formula 1:

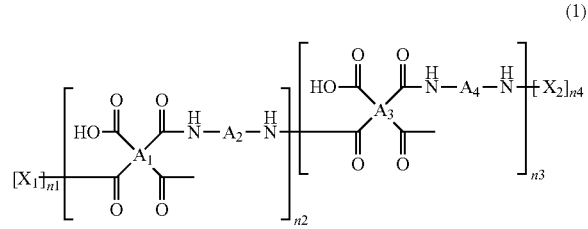

(1)

wherein

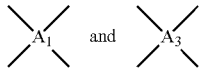

are the same as or different from each other and each independently have one of the structures of Formulae 3a to 3f, -$A_2$- and -$A_4$- are the same as or different from each other and each independently have one of the structures of Formulae 4a to 4j, —$X_1$ and —$X_2$ are the same as or different from each other and each independently have one of the structures of Formulae 5a to 5d, both n1 and n4 are 1, and n2 and n3 are the same as or different from each other and are each independently an integer from 0 to 10,000, with the proviso that at least one of n2 and n3 is not zero.

According to another embodiment of the present invention, both n1 and n4 are 1. The ratio of n1 to n2 (n1:n2) is from 1:1 to 1:20, the ratio of n1 to n3 (n1:n3) is from 1:1 to 1:20, and the ratio of n2 to n3 (n2:n3) is from 1:20 to 20:1.

The ratio (n2+n3)/n1 may be from 1:20 to 20:1. If (n2+n3)/n1 is lower than 1, a polyimide sponge with desired levels of mechanical or chemical properties is difficult to obtain. Meanwhile, if (n2+n3)/n1 exceeds 20, crosslinking by the end-capping functional groups does not substantially occur, making it difficult to obtain a polyimide sponge with desired levels of mechanical or chemical properties.

According to another embodiment of the present invention, the ratio n1:(n2+n3):n4 is 1:1-20:1. If (n2+n3)/n1 or (n2+n3)/n4 is lower than 1, a polyimide sponge with desired levels of mechanical or chemical properties is difficult to obtain. Meanwhile, if (n2+n3)/n1 or (n2+n3)/n4 exceeds 20, crosslinking by the end-capping functional groups does not substantially occur, making it difficult to obtain a polyimide sponge with desired levels of mechanical or chemical properties.

According to another embodiment of the present invention, step (C) may include (C') imidizing the polyamic acid and (C'') crosslinking the $X_1$ and $X_2$ sites.

According to another embodiment of the present invention, the one or two dianhydrides are selected from pyromellitic dianhydride (PMDA), 4,4'-oxydiphthalic dianhydride (ODPA), 3,3',4,4'-biphenyltetracarboxylic dianhydride (BPDA), 3,3'4,4'-benzophenonetetracarboxylic dianhydride (BTDA), 4,4'-(hexafluoroisopropylidene)diphthalic dianhydride (6FDA), and 3,3',4,4'-diphenylsulfone tetracarboxylic dianhydride (DSDA).

According to another embodiment of the present invention, the one or two diamines are selected from 4,4'-oxydianiline (4,4'-ODA), phenylmethyldiamine, 3,4'-oxydianiline (3,4'-ODA), 1,4-phenylenediamine (1,4-PDA), 4,4'-sulfonyldianiline (4,4'-DDS), 2,2'-bis(3-amino-4-hydroxyphenyl)hexafluoropropane (AHHFP), 2,2'-bis(4-aminophenyl)hexafluoropropane (BAPFP), 4,4'-diaminodiphenylmethane (MDA), bis(4-aminophenyl) sulfone (BAPS), bis[4-(4-aminophenoxy)phenyl]sulfone, and bis[4-(3-aminophenoxy)phenyl]sulfone.

According to another embodiment of the present invention, the one or two end-capping agents are selected from monomethyl 5-norbornene-2,3-dicarboxylate, dimethyl 5-norbornene-2,3-dicarboxylate, cis-5-norbornene-endo-2,3-dicarboxylic acid, cis-norbornene-endo-2,3-dicarboxylic anhydride, cis-norbornene-exo-2,3-dicarboxylic anhydride, 3-aminophenylacetylene, maleic anhydride, and 3-aminophenylcyclobutene, which are represented by Formulae 7a to 7h, respectively:

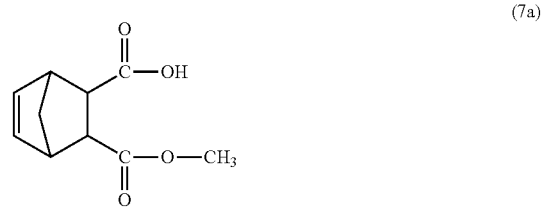

(7a)

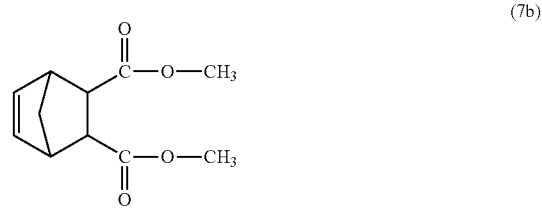

(7b)

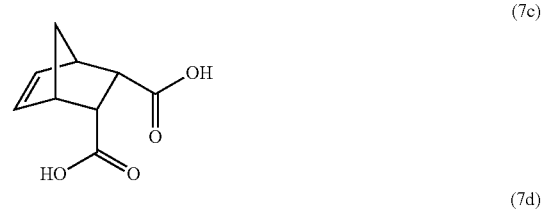

(7c)

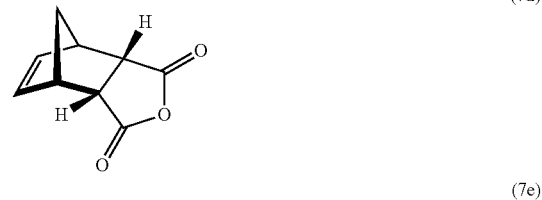

(7d)

(7e)

(7f)

(7g)

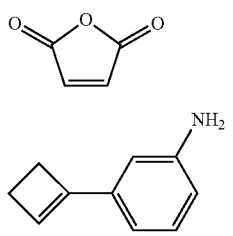

(7h)

End-capping with each of the compounds of Formulae 7a to 7e forms the structure of Formula 5a. End-capping with the compounds of Formulae 7f to 7h form the structures of Formulae 5b to 5d, respectively.

According to another embodiment of the present invention, the content of the polyamic acid in the polyamic acid solution is from 1 to 50% by weight, based on the total weight of the solution. If the polyamic acid content is outside the range defined above, i.e. it is less than 1% by weight or exceeds 50% by weight, the resulting sponge has a low degree of pore size uniformity, and as a result, its ability to capture drugs is limited when used later in drug delivery systems and other applications.

According to another embodiment of the present invention, the polyamic acid solution may further include a filler. The filler may be selected from silica, clay, zirconium, and mixtures thereof. The filler may be included in an amount of 0.01 to 10 parts by weight, based on 100 parts by weight of the polyamic acid solution.

According to another embodiment of the present invention, the filler is added in step (A) or (A'). It is preferred to add the filler after either the dianhydrides or the diamines are dissolved and before the other monomers are added. For example, the filler may be added after dissolution of the dianhydrides and before addition of the diamines. Alternatively, the filler may be added after dissolution of the diamines and before addition of the dianhydrides. The order of addition of the filler ensures further improved thermal properties and mechanical properties of a sponge.

A further aspect of the present invention is directed to a polyimide sponge having a structure of Formula 2:

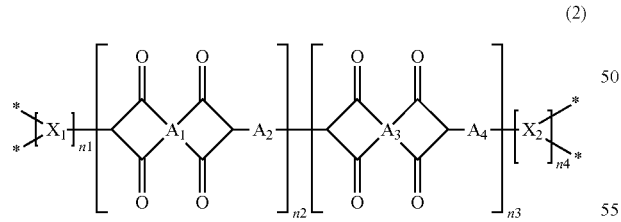

(2)

wherein

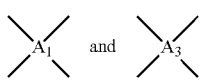

are the same as or different from each other and each independently have one of the structures of Formulae 3a to 3f:

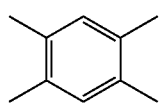

(3a)

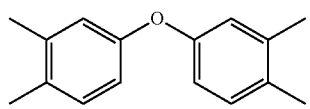

(3b)

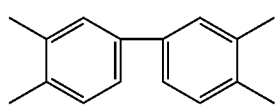

(3c)

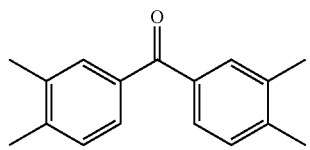

(3d)

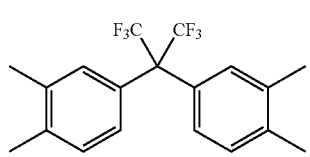

(3e)

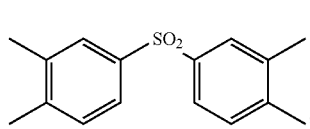

(3f)

$-A_2-$ and $-A_4-$ are the same as or different from each other and each independently have one of the structures of Formulae 4a to 4j:

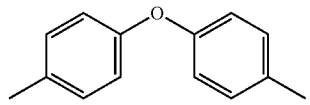

(4a)

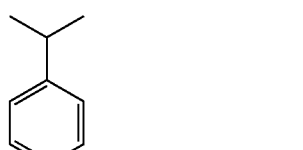

(4b)

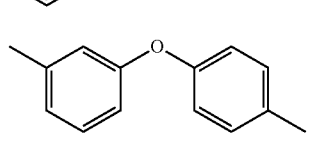

(4c)

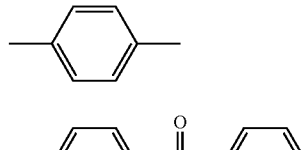

(4d)

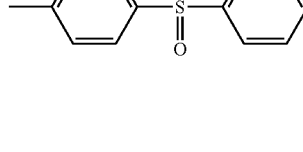

(4e)

(4f)
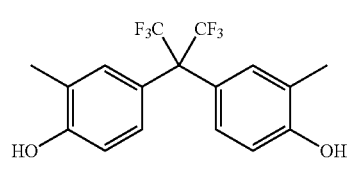

(4g)
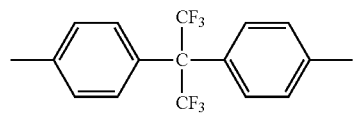

(4h)
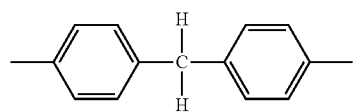

(4i)
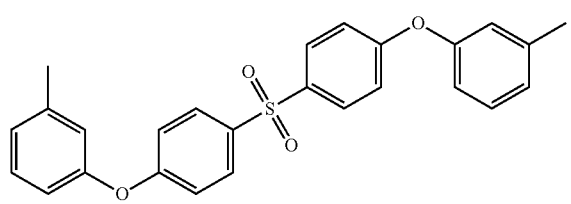

(4j)
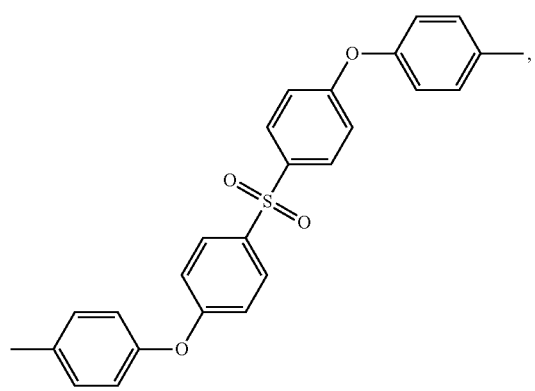

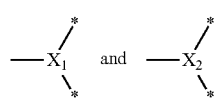

are the same as or different from each other and each independently have the structure of Formula 6:

(6)
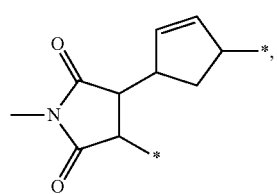

both n1 and n4 are 0 or 1, and n2 and n3 are the same as or different from each other and are each independently an integer from 0 to 10,000, with the proviso that at least one of n2 and n3 is not zero.

According to another embodiment of the present invention, both n1 and n4 in Formula 2 are 1. The polyimide sponge whose both ends are capped has the following structural and physical properties: a porosity of 70 to 90%, as measured by the BET method and the mercury intrusion method, a specific surface area of 95 to 110 m²/g, as measured by the nitrogen BET method, a pore size of 2 to 100 nm, as measured by the BJH method, a peak at 2 to 7 nm in the pore size distribution curve obtained by the BJH method, a pore size of 4 to 100 nm, as measured by the mercury intrusion method, a peak at 10 to 20 nm in the pore size distribution curve obtained by the mercury intrusion method, a 1% decomposition temperature of 565 to 570° C., as measured by TGA analysis, a 5% decomposition temperature of 580 to 590° C., as measured by TGA analysis, and a glass transition temperature of 430 to 450° C., as measured by DSC analysis.

According to another embodiment of the present invention, the polyimide sponge is produced in accordance with the embodiments of the present invention.

According to another embodiment of the present invention, the polyimide sponge has a structure in which both ends are not capped, represented by Formula 2a:

(2a)
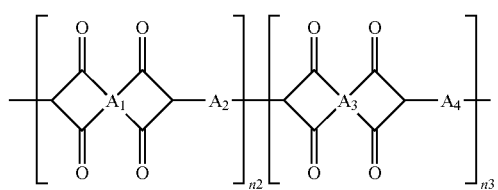

wherein

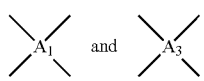

are the same as or different from each other and each independently have one of the structures of Formulae 3a to 3f, -A₂- and -A₄- are the same as or different from each other and each independently have one of the structures of Formulae 4a to 4j, and n2 and n3 are the same as or different from each other and are each independently an integer of 0 to 10,000, with the proviso that at least one of n2 and n3 is not zero.

According to another embodiment of the present invention, the non-end-capped polyimide sponge has the following structural and physical properties: a porosity of 70 to 90%, as measured by the BET method and the mercury intrusion method, a specific surface area of 95 to 110 m²/g, as measured by the nitrogen BET method, a pore size of 2 to 100 nm, as measured by the BJH method, a peak at 2 to 7 nm in the pore size distribution curve obtained by the BJH method, a pore size of 4 to 100 nm, as measured by the mercury intrusion method, a peak at 10 to 20 nm in the pore size distribution curve obtained by the mercury intrusion method, a 1% decomposition temperature of 565 to 570° C., as measured by TGA analysis, a 5% decomposition temperature of 580 to 590° C., as measured by TGA analysis, and a glass transition temperature of 320 to 340° C., as measured by DSC analysis.

Below is a more detailed description of the present invention.

It is preferred to allow an aromatic dianhydride to react with an aromatic diamine in the same molar proportions. The aromatic dianhydride and the aromatic diamine are the same as those mentioned above. First, the dianhydride reacts with the amine groups of the diamine at both terminal rings thereof to prepare a polyamic acid precursor in the form of a solution, as depicted in Reaction 1:

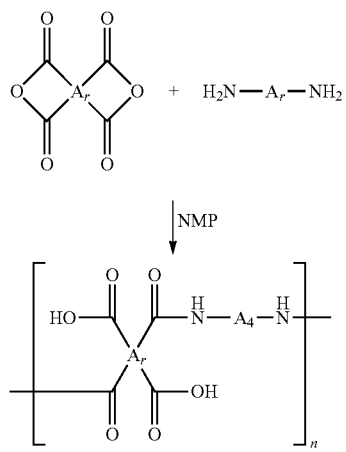

(1)

Thereafter, the polyamic acid is subjected to imidization. As a result of the imidization, the polyamic acid is dehydrated and condensed to form a polyimide resin, as depicted in Reaction 2.

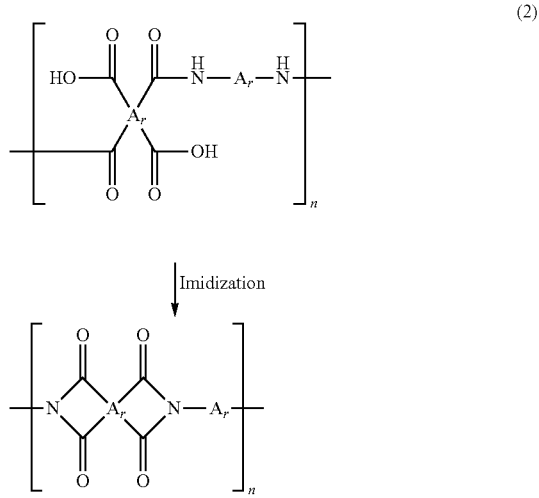

(2)

According to a specific embodiment, the polyimide sponge is produced by filling a closed reactor with acetone, coating glass with the polyamic acid precursor, immersing the coated glass in the acetone, withdrawing the immersed coated glass from the reactor, followed by curing in an oven. The polyimide sponge has a stack structure of microporous nets.

Another aspect of the present invention is directed to a support for a fuel cell electrolyte membrane including the polyimide sponge. For use in a fuel cell electrolyte membrane, the support may be impregnated with a polyethylene or polypropylene electrolyte polymer. The impregnation may be accomplished by immersing the support in the polymer electrolyte solution or allowing the solution to permeate the support.

Another aspect of the present invention is directed to a filter including the polyimide sponge. The polyimide sponge can also be used as a filter. In this case, the filter is advantageously applicable to an environment where highly heat and chemical resistant materials are present.

Another aspect of the present invention is directed to an adsorbent including the polyimide sponge.

Yet another aspect of the present invention is directed to a method for controlling the pore radius of a polyamide sponge, including controlling the height of a liquid medium placed in a closed reactor, (B) immersing a substrate surface coated with a polyamic acid solution in the liquid medium, and (C) withdrawing the immersed substrate surface coated with the polyamic acid from the liquid medium, followed by curing in an oven wherein the polyamic acid has the structure of Formula 1.

The present invention will be explained in more detail with reference to the following examples. However, these examples are not to be construed as limiting or restricting the scope and disclosure of the invention. It is to be understood that based on the teachings of the present invention including the following examples, those skilled in the art can readily practice other embodiments of the present invention whose experimental results are not explicitly presented. It will also be understood that such modifications and variations are intended to come within the scope of the appended claims.

EXAMPLES

Preparative Example 1: Preparation of Polyamic Acid Precursor

A polyamic acid precursor was synthesized according to the following schematic reaction 3:

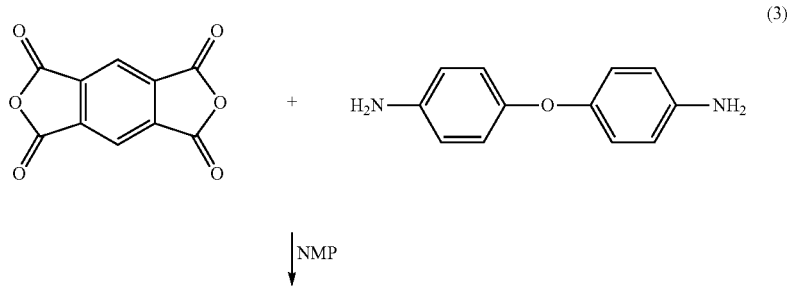

(3)

-continued

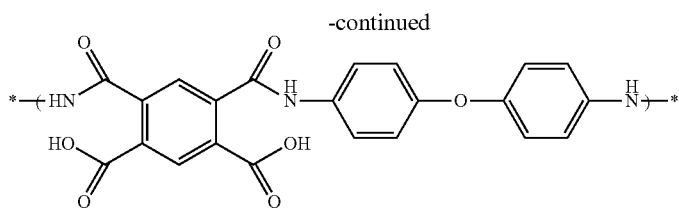

First, 2.002 g (10 mmol) of 4,4'-oxydianiline was added to a 100 mL Erlenmeyer flask and 23.8 g of NMP as a polar solvent was added thereto. The mixture was stirred to achieve complete dissolution. To the solution was added pyromellitic dianhydride (PDMA, 2.18 g, 10 mmol) in the same number of moles as that of the 4,4'-oxydianiline. The resulting mixture was stirred under a nitrogen atmosphere at 20° C. for 24 h.

Example 1: Production of Polyimide Sponge in which Microporous Nets were Stacked A polyimide sponge was produced using the polyamic acid precursor prepared in Preparative Example 1 according to the following schematic reaction 4:

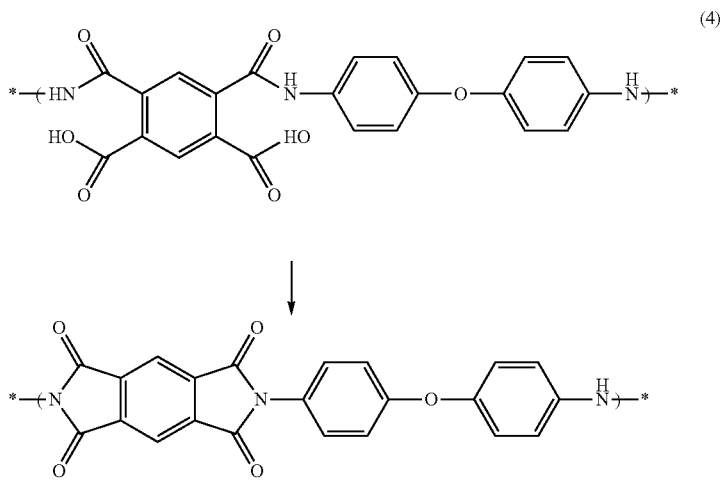

(4)

The polyamic acid composition prepared in Preparative Example 1 was coated on glass and immersed in a reactor filled with acetone for 2 h. During the immersion, the solvent was extracted by wet phase separation. The immersed coated glass was withdrawn from the reactor and thermally cured stepwise at 150° C. for 6 h, at 200° C. for 1 h, and at 250° C. for 1 h in an oven, affording a polyimide sponge.

Test Example 1: Thermogravimetric Analysis

Thermogravimetric analysis was performed to evaluate the thermal stability of the high functional polyimide sponge produced in Example 1. Specifically, changes in the weight of the polyimide sponge were measured while heating from room temperature to 800° C.

The results are shown in FIG. 1. From the results, it was confirmed that the sponge was highly thermally stable even at high temperatures.

The 1% and 5% weight loss temperatures of the sponge were 570° C. and 587° C., respectively, revealing very high thermal stability of the sponge.

Test Example 2: SEM Measurement

Surface images of the high functional polyimide sponge produced in Example 1 were taken by SEM to determine the pore size of the sponge.

Figure 2:
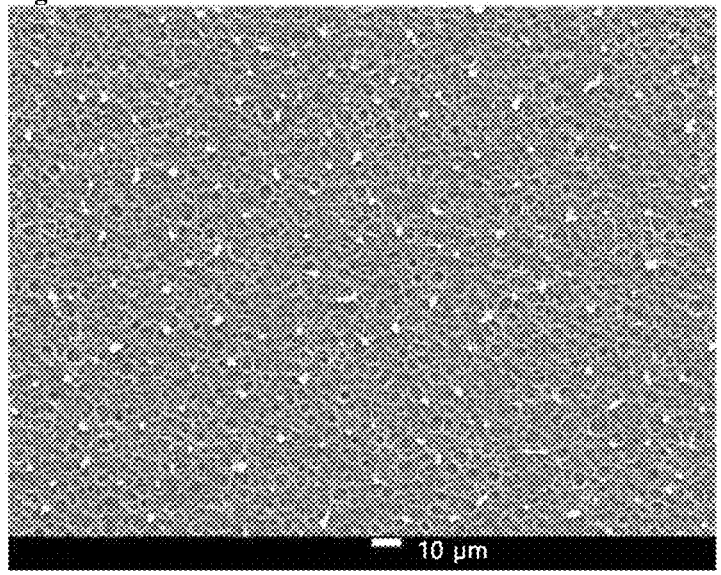
FIG. 2 is a SEM image showing the front surface of a polyimide sponge according to one embodiment of the present invention.
Figure 3:
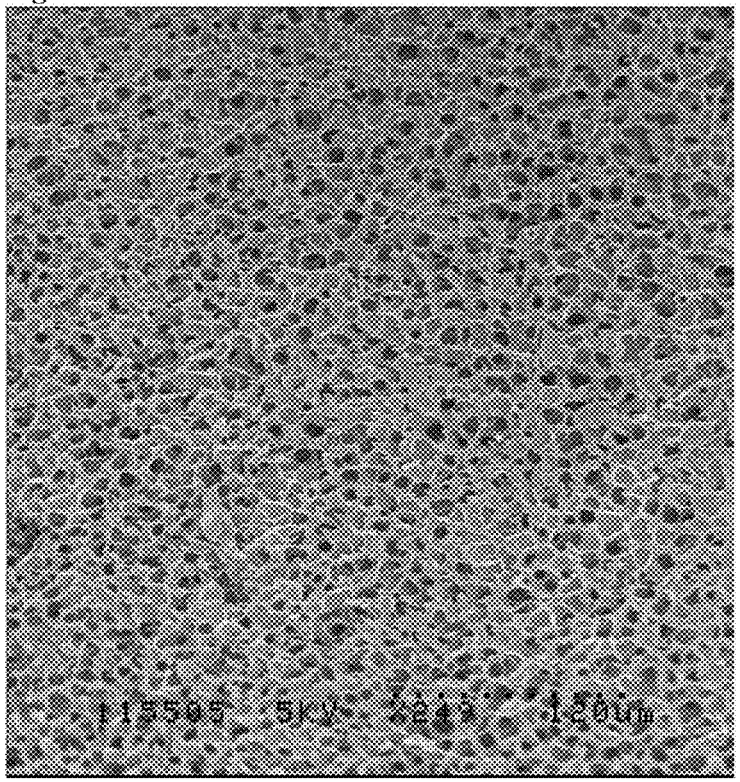
FIG. 3 is a SEM image showing the back surface of a polyimide sponge according to one embodiment of the present invention.
Figure 4:
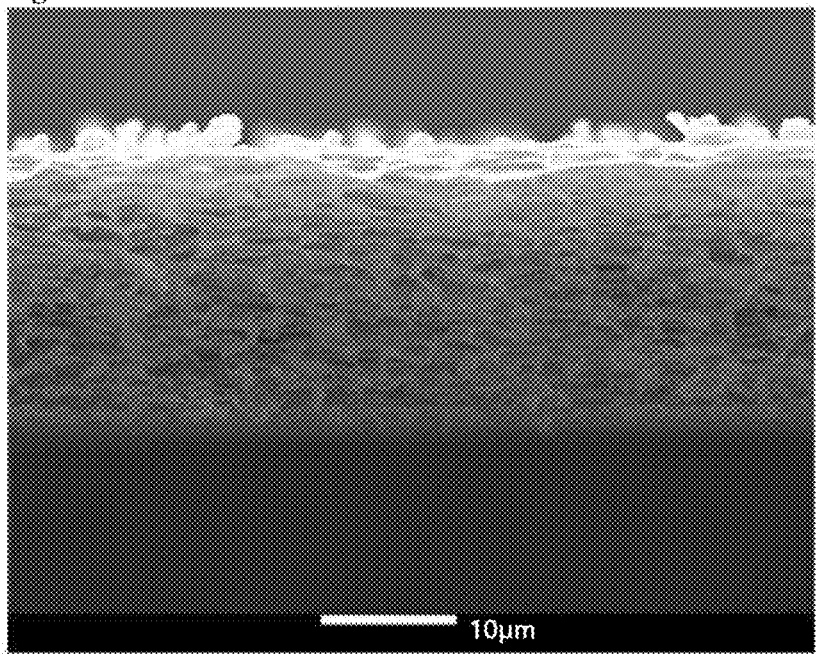
FIG. 4 is a SEM image showing the cross-section of a polyimide sponge according to one embodiment of the present invention.

FIGS. 2 to 4 are SEM images showing the front surface, back surface, and cross-section of the high functional polyimide sponge. These images reveal that the polyimide sponge was uniform in pore distribution and structure.

Test Example 3: Porosity Measurement

Nitrogen adsorption and mercury adsorption tests were conducted to measure the porosity of the polyimide sponge produced in Example 1. As a result, the sponge was found to have a specific surface area of 110 $m^2/g$, as measured by the BET nitrogen adsorption method, a pore size of 2 to 100 nm, as measured by the BJH method, a peak at 2 to 7 nm in the pore size distribution curve obtained by the BJH method, a pore size of 4 to 100 nm, as measured by the mercury intrusion method, and a peak at 10 to 20 nm in the pore size distribution curve obtained by the mercury intrusion method.

What is claimed is:

1. A method for producing a polyimide sponge, comprising:
    (B) immersing a substrate surface coated with a polyamic acid solution in a liquid medium placed in a closed reactor; and (C) withdrawing the immersed substrate surface coated with the polyamic acid from the liquid medium, followed by curing in an oven;

wherein the polyamic acid has a structure of Formula 1:

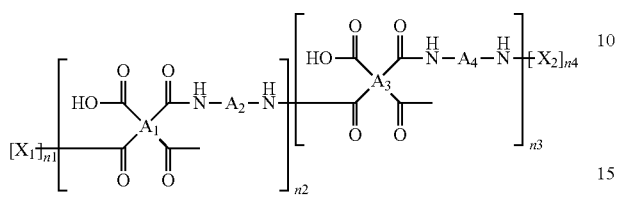

(1)

wherein

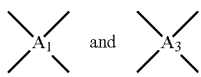

are the same as or different from each other and each independently have one of the structures of Formulae 3a to 3f:

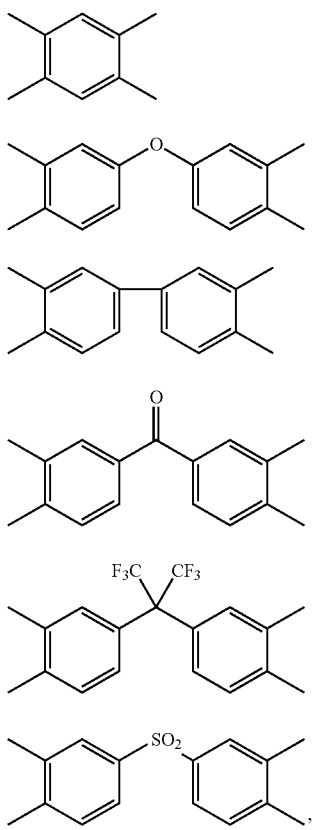

wherein -A$_2$- and -A$_4$- are the same as or different from each other and each independently have one of the structures of Formulae 4a to 4j:

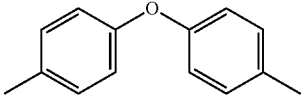
(4a)

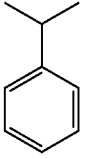
(4b)

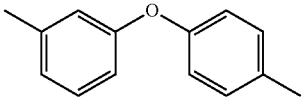
(4c)

(4d)

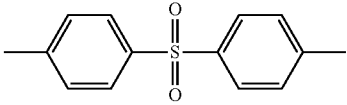
(4e)

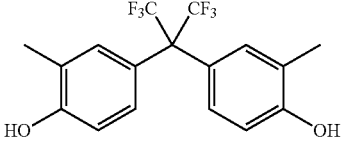
(4f)

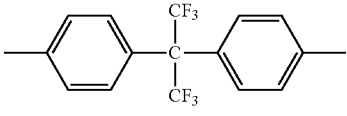
(4g)

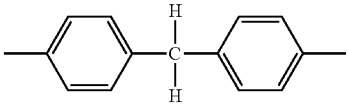
(4h)

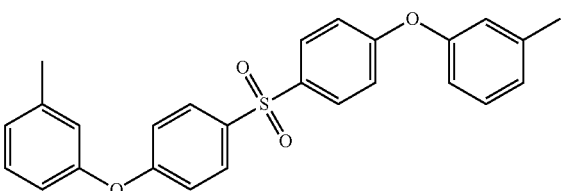
(4i)

-continued (4j)

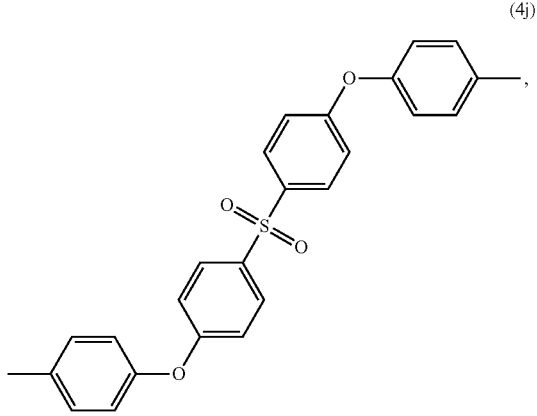

wherein —X₁ and —X₂ are the same as or different from each other and each independently have one of the structures of Formulae 5a to 5d:

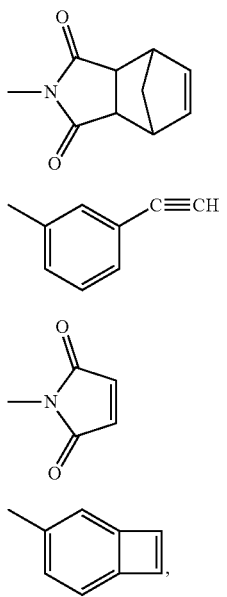

(5a)

(5b)

(5c)

(5d)

wherein both n1 and n4 are 0 or 1, and n2 and n3 are the same as or different from each other and are each independently an integer from 0 to 10,000, with the proviso that at least one of n2 and n3 is not zero; and wherein the liquid medium is a mixed solvent of acetone and ethyl acetate in a 1:0.5-2 volume ratio.

2. The method according to claim 1, wherein the liquid medium is a mixed solvent of acetone and ethyl acetate in a 1:0.5-2 volume ratio.

3. The method according to claim 1, wherein the heating in the oven is performed stepwise at 120 to 160° C. for 4 to 7 hours, at 190 to 210° C. for 0.5 to 2 hours, and at 240 to 260° C. for 0.5 to 2 hours.

4. The method according to claim 1, wherein step (B) comprises:
(B1) determining a desired average pore radius of a polyimide sponge,
(B2) determining the height of a liquid medium such that the average pore radius is obtained, and
(B3) immersing a substrate surface coated with a polyamic acid solution in the liquid medium, whose height has been previously determined in a closed reactor, the height of the liquid medium being the distance from the polyamic acid coated on the surface of the substrate to the surface of the liquid medium.

5. The method according to claim 4, wherein substep (B2) is carried out by determining the height of the liquid medium from a relationship with the previously determined average pore radius.

6. The method according to claim 5, wherein the relationship between the average pore radius $r_p$ and the height $h_s$ of the liquid medium is given by Equation 1 or 2:

$$r_p = k/h_s \quad (1)$$

$$r_p = a \times h_s + b \quad (2)$$

where k, a, and b are proportionality constants that are determined empirically.

7. A method for producing a polyimide sponge, comprising:
(A') reacting one or two dianhydrides with one or two diamines to obtain a polyamic acid solution,
(A") adding one or two end-capping agents to the polyamic acid solution to end-cap the polyamic acid solution,
(B) immersing a substrate surface coated with the end-capped polyamic acid solution in a liquid medium placed in a closed reactor, and
(C) withdrawing the immersed substrate surface coated with the polyamic acid from the liquid medium, followed by curing in an oven;
wherein the polyamic acid has a structure of Formula 1:

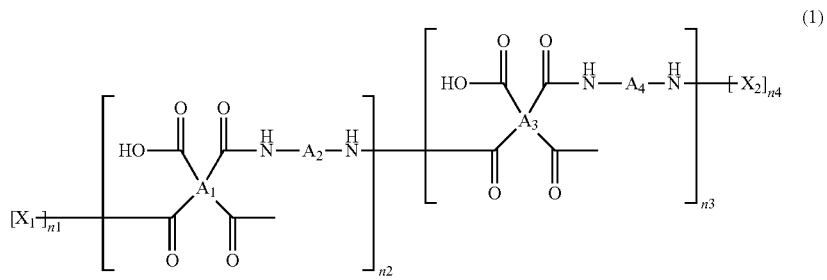

(1)

wherein

 and 

are the same as or different from each other and each independently have one of the structures of Formulae 3a to 3f:

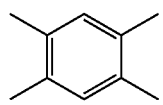 (3a)

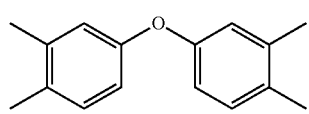 (3b)

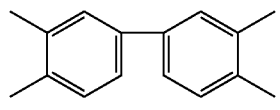 (3c)

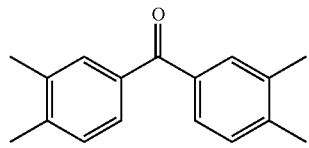 (3d)

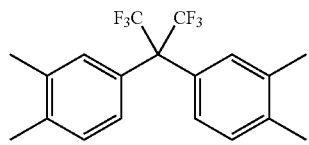 (3e)

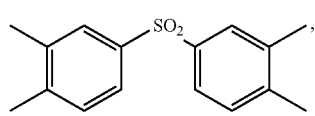 (3f)

wherein -A$_2$- and -A$_4$- are the same as or different from each other and each independently have one of the structures of Formulae 4a to 4j:

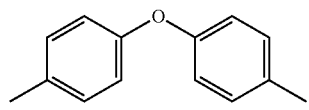 (4a)

 (4b)

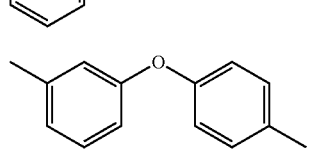 (4c)

 (4d)

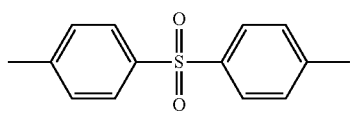 (4e)

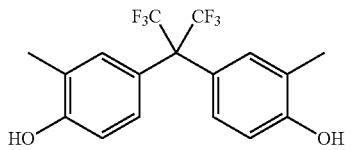 (4f)

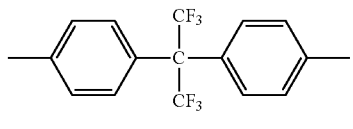 (4g)

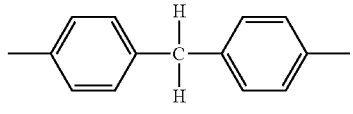 (4h)

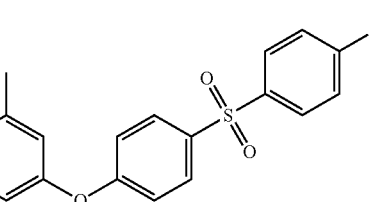 (4i)

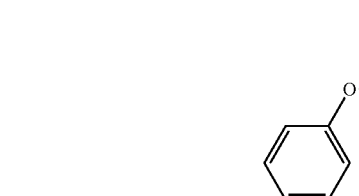 (4j)

wherein —X$_1$ and —X$_2$ are the same as or different from each other and each independently have one of the structures of Formulae 5a to 5d:

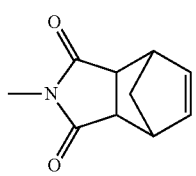 (5a)

-continued

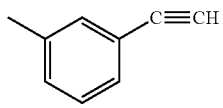
(5b)

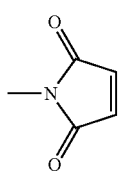
(5c)

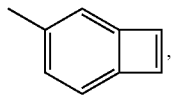
(5d)

wherein both n1 and n4 are 0 or 1, and n2 and n3 are the same as or different from each other and are each independently an integer from 0 to 10,000, with the proviso that at least one of n2 and n3 is not zero; and wherein at least one of the following is true:
  (i) the liquid medium is a mixed solvent of acetone and ethyl acetate in a 1:0.5-2 volume ratio; or
  (ii) the ratio n1:(n2+n3):n4 is 1:1-20:1.

8. The method according to claim 7, wherein the polyamic acid has a structure of Formula 1:

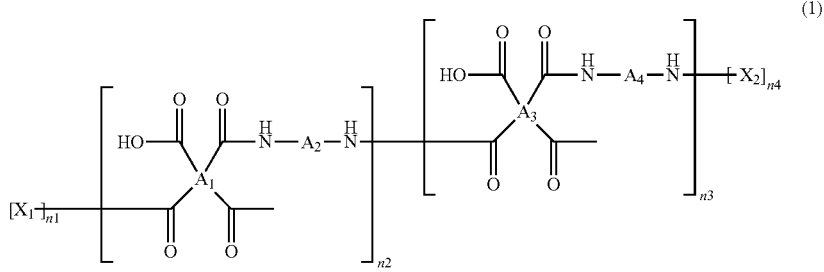
(1)

wherein

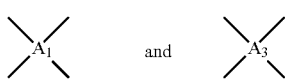

are the same as or different from each other and each independently have one of the structures of Formulae 3a to 3f,
  wherein -A$_2$- and -A$_4$- are the same as or different from each other and each independently have one of the structures of Formulae 4a to 4j,
  wherein —X$_1$ and —X$_2$ are the same as or different from each other and each independently have one of the structures of Formulae 5a to 5d, and
  wherein both n1 and n4 are 1, and n2 and n3 are the same as or different from each other and are each independently an integer from 0 to 10,000, with the proviso that at least one of n2 and n3 is not zero.

9. The method according to claim 1, wherein both n1 and n4 are 1, the ratio of n1 to n2 (n1:n2) is from 1:1 to 1:20, the ratio of n1 to n3 (n1:n3) is from 1:1 to 1:20, the ratio of n2 to n3 (n2:n3) is from 1:20 to 20:1, and the ratio (n2+n3):n1 is from 1:20 to 20:1.

10. The method according to claim 1, wherein the ratio n1:(n2+n3):n4 is 1:1-20:1.

11. The method according to claim 1, wherein step (C) comprises (C') imidizing the polyamic acid and (C") cross-linking the X$_1$ and X$_2$ sites.

12. The method according to claim 7, wherein the one or two end-capping agents are selected from monomethyl 5-norbornene-2,3-dicarboxylate, dimethyl 5-norbornene-2,3-dicarboxylate, cis-5-norbornene-endo-2,3-dicarboxylic acid, cis-norbornene-endo-2,3-dicarboxylic anhydride, cis-norbornene-exo-2,3-dicarboxylic anhydride, 3-aminophenylacetylene, maleic anhydride, and 3-aminophenylcyclobutene, which are represented by Formulae 7a to 7h, respectively:

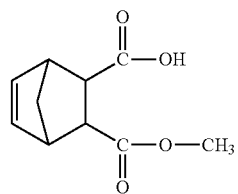
(7a)

-continued

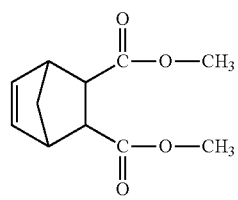
(7b)

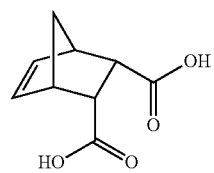
(7c)

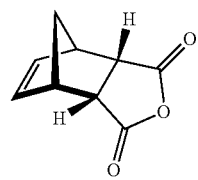
(7d)

-continued

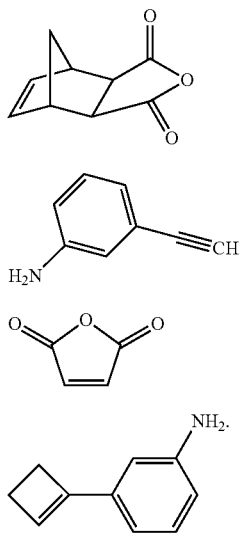

(7e)

(7f)

(7g)

(7h)

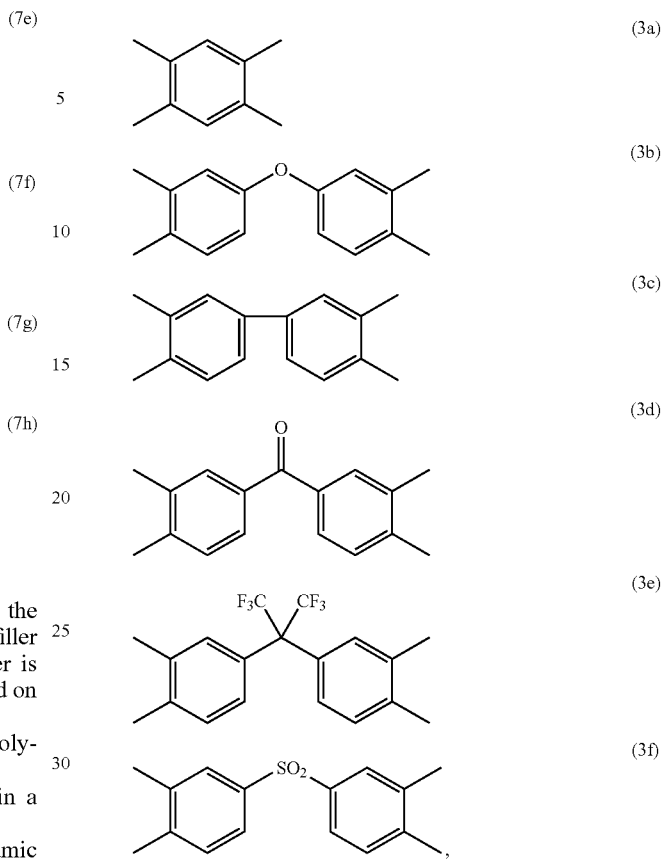

(3a)

(3b)

(3c)

(3d)

(3e)

(3f)

13. The method according to claim 1, wherein the polyamic acid solution further comprises at least one filler selected from silica, clay, and zirconium and the filler is present in an amount of 0.01 to 10 parts by weight, based on 100 parts by weight of the polyamic acid solution.

14. A method for controlling the pore radius of a polyamide sponge, comprising:
controlling the height of a liquid medium placed in a closed reactor,
(B) immersing a substrate surface coated with a polyamic acid solution in the liquid medium, and
(C) withdrawing the immersed substrate surface coated with the polyamic acid from the liquid medium, followed by curing in an oven;
wherein the polyamic acid has a structure of Formula 1:

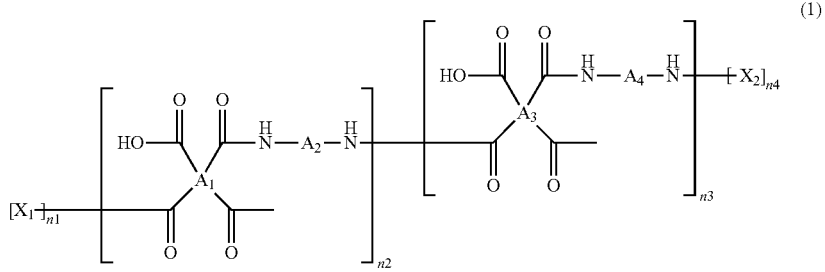

(1)

wherein

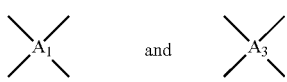

are the same as or different from each other and each independently have one of the structures of Formulae 3a to 3f:

wherein -$A_2$- and -$A_4$- are the same as or different from each other and each independently have one of the structures of Formulae 4a to 4j:

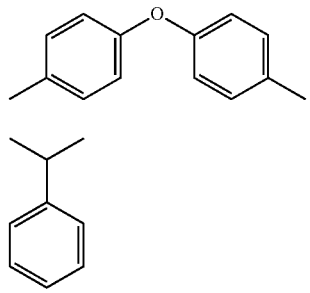

(4a)

(4b)

-continued (4c) 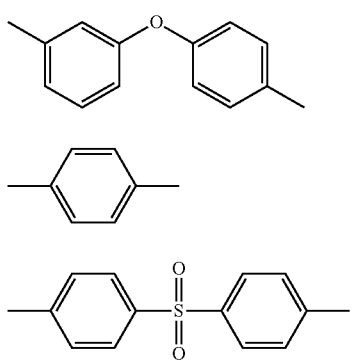

(4d) 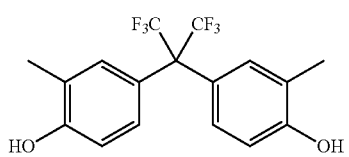

(4e) 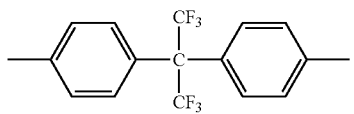

(4f) 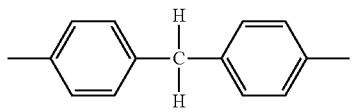

(4g) 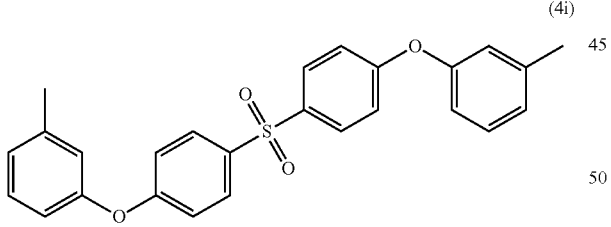

(4h)

(4i)

-continued (4j) 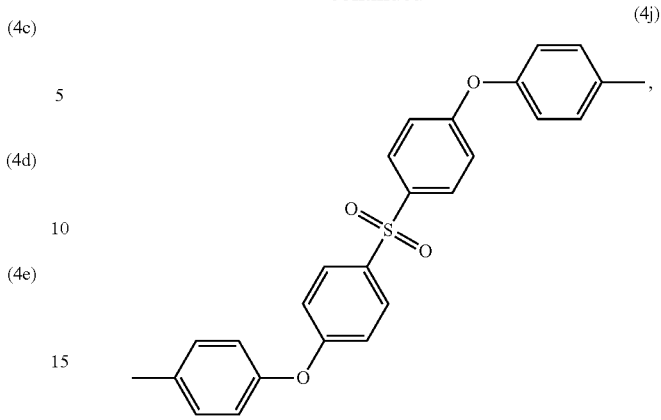

wherein —$X_1$ and —$X_2$ are the same as or different from each other and each independently have one of the structures of Formulae 5a to 5d:

(5a) 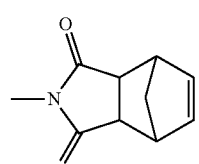

(5b) 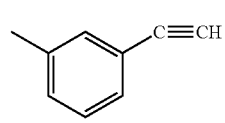

(5c) 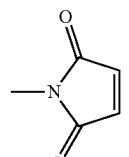

(5d) 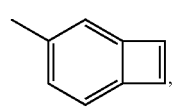

wherein both n1 and n4 are 0 or 1, and n2 and n3 are the same as or different from each other and are each independently an integer from 0 to 10,000, with the proviso that at least one of n2 and n3 is not zero; and wherein the liquid medium is a mixed solvent of acetone and ethyl acetate in a 1:0.5-2 volume ratio.

* * * * *